(12) United States Patent
Shao et al.

(10) Patent No.: US 10,671,288 B2
(45) Date of Patent: Jun. 2, 2020

(54) HIERARCHICAL SPARSE TENSOR COMPRESSION METHOD IN ARTIFICIAL INTELLIGENT DEVICES

(71) Applicant: Nanjing Iluvatar CoreX Technology Co., Ltd., Nanjing (CN)

(72) Inventors: Pingping Shao, San Jose, CA (US); Jiejun Chen, Shanghai (CN); Yongliu Wang, Shanghai (CN)

(73) Assignee: Nanjing Iluvatar CoreX Technology Co., Ltd., Nanjing (CN)

( * ) Notice: Subject to any disclaimer, the term of this patent is extended or adjusted under 35 U.S.C. 154(b) by 12 days.

(21) Appl. No.: 16/237,616

(22) Filed: Dec. 31, 2018

(65) Prior Publication Data

US 2020/0042189 A1  Feb. 6, 2020

(30) Foreign Application Priority Data

Aug. 1, 2018  (CN) .......................... 2018 1 0862705

(51) Int. Cl.
*G06F 3/06* (2006.01)
*G06F 12/0802* (2016.01)
*G06N 5/02* (2006.01)
*H03M 7/30* (2006.01)
*G06F 12/0811* (2016.01)

(52) U.S. Cl.
CPC .......... *G06F 3/0608* (2013.01); *G06F 3/0655* (2013.01); *G06F 3/0673* (2013.01); *G06F 12/0802* (2013.01); *G06N 5/02* (2013.01); *H03M 7/3066* (2013.01); *G06F 12/0811* (2013.01); *G06N 5/022* (2013.01)

(58) Field of Classification Search
CPC ............... G06F 3/0608; G06F 12/0802; G06F 12/0811; G06N 5/022
USPC ......................................................... 711/118
See application file for complete search history.

(56) References Cited

U.S. PATENT DOCUMENTS

| | | | |
|---|---|---|---|
| 2018/0315158 A1* | 11/2018 | Nurvitadhi | G06T 1/20 |
| 2019/0042870 A1* | 2/2019 | Chen | G06K 9/6267 |
| 2019/0043201 A1* | 2/2019 | Strong | G06T 7/11 |
| 2019/0044703 A1* | 2/2019 | Smith | G06N 3/08 |
| 2019/0045207 A1* | 2/2019 | Chen | G06F 21/45 |
| 2019/0139182 A1* | 5/2019 | Nurvitadhi | G06T 1/20 |

* cited by examiner

*Primary Examiner* — Than Nguyen
(74) *Attorney, Agent, or Firm* — Loeb & Loeb, LLP (57) ABSTRACT

A hierarchical sparse tensor compression method based on artificial intelligence devices, in DRAM, not only saves the storage space of the neuron surface, but also adds a meta-surface to the mask block. When reading data, the mask is first read, then the size of the non-zero data is calculated, and only these non-zero data are read to save DRAM bandwidth. In the cache, only non-zero data is stored, so the required storage space is reduced. When processing data, only non-zero data is used. The method uses a bit mask to determine if the data is zero. There are three levels in the hierarchical compression scheme: tiles, lines, and points, reading bit-masks and non-zero data from DRAM, and saving bandwidth by not reading zero data. When processing data, if their bit mask is zero, the tile data may be easily removed.

5 Claims, 8 Drawing Sheets

HIERARCHICAL SPARSE TENSOR COMPRESSION METHOD IN ARTIFICIAL INTELLIGENT DEVICES

CROSS-REFERENCE TO RELATED APPLICATION

This US nonprovisional patent application claims priority to a Chinese invention application serial number 201810862705.2, filed on Aug. 1, 2018, whose disclosure is incorporated by reference in its entirety herein.

TECHNICAL FIELD

Aspects of the invention generally relate to the field of artificial intelligence (AI), and, in particular, relate to a layered sparse tensor compression method based on graphic data.

BACKGROUND

Artificial intelligence (AI) processing has been a popular topic recently, both in terms of computationally and memory intensive, as well as high performance-power efficiency. Accelerating computing with current devices such as CPUs and GPUs is not easy, and many solutions such as GPU+TensorCore, tensor processing unit (TPU), central processing unit (CPU)+field programmable gate array (FPGA), and AI application-specific integrated circuit (ASIC) have been proposed to address these problems. GPU+TensorCore tends to focus on solving computationally intensive problems, while TPU tends to focus on computation and data reuse, and CPU+FPGA/AI ASICs focus on improving performance-power efficiency.

In artificial intelligence processing, many data are zero due to neuron activation and weight pruning. In order to use these sparsity, it is necessary to propose a compression method that achieve one or more of the following benefits: may save computation, may save power consumption while skipping zero neurons or convolution weights, may reduce the required buffer storage space, and may increase DRAM bandwidth by not transmitting zero data.

Although there are many similar solutions currently, they only use a single layer compression scheme, and this does not have obvious advantages. With a bit mask of two or more layers, if the advanced mask is 0, we can easily remove high-level data, which means that all of the branches are zero, but the traditional single-layer mask Compression cannot get this result.

SUMMARY

Embodiments of the invention attempt to overcome deficiencies in the prior art and provide a layered sparse tensor compression method based on graphical data. In one aspect, embodiments of the invention apply a tile-based layered compression scheme that makes it easy to know which tile has all zero values so that they may be removed from the pipeline, which eliminates many unnecessary data movements and saves time and power.

In order to achieve the above, aspects of the invention include embodiments that:

A hierarchical sparse tensor compression method based on artificial intelligence device wherein:

a hardware architecture that may include: a host, a frontal engine, a parietal engine, a renderer engine, an occipital engine, a temporal engine, and a random access memory (RAM). In one example, the frontal engine may obtain a 5D tensor from the host and divide it into several groups of tensors. These groups of tensors may be sent or transmitted to the parietal engine, and the parietal engine may take the groups of tensors to further divide them into several tensors. In one embodiment, the parietal engine may send these tensors to the renderer engine for execution as an input feature renderer and may send a partial amount of tensors as an output to the occipital engine. In one embodiment, the occipital engine may accumulate the partial amount of tensors and may execute them as an output feature to the renderer engine. In one aspect, the occipital engine may send the output feature as the final tensor to the temporal engine. The temporal engine may compress the final tensor before storing or saving it to the internal memory.

In one embodiment, the hardware architecture may be provided with a layered cache design. For example, the temporal engine may configure level-three (L3) cache and may be connected to the DRAM memory controller to acquire or retrieve data from the DRAM memory. In one embodiment, the frontal engine may be configured with a level-two (L2) cache and a level-one (L1) cache in a neuron block;

In one example, aspects of the invention not only reduce storage usage of the surface of the neuron in the DRAM but also add a meta-surface to the mask block. With such arrangement, when reading the data, the mask is read first. The size of the non-zero data may be calculated and only the non-zero data is read. The non-zero data, in one embodiment, is then stored in the cache. When processing data, only the non-zero data is processed.

Based on the improved embodiments of the invention described above, one or more implementations include:

In one embodiment, the compression method may provide that the data is stored block by block in DRAM, and each block has the same internal memory size. In this approach, the non-zero lines in the block are packed and moved to the beginning of the block, and all other data in the block is not to be read or used.

When data is transferred to the L3 cache, in one approach, only the non-zero data in the non-zero line is read and stored in the L3 cache. In one aspect, the meta-surface of the bit mask is also stored in the DRAM. The temporal engine, in one example, may read the bit mask before reading the non-zero data to calculate an effect data length. When the L3 cache sends data to the L2 cache, a super tile is decompressed and the compressed tile data is sent to the L2 cache.

In one embodiment, the L2 cache stores the compressed tile data in the compressed format. The data is further decompressed, reorganized, and recompressed before sending it to the level one (L1) cache. The compressed data from the L1 cache is read and sent to the computer's process, with the uncompressed data having location information being processed in the register file.

In a further embodiment, the occipital engine may provide an output, the output data is compressed. The bitmask and non-zero data are sent to the temporal engine, and the temporal engine may further compress the compressed output data before sending the data to the DRAM.

Aspects of the invention may provide one or more benefits and advantages, including: the DRAM bandwidth may be saved when such a data compression scheme is applied in an artificial intelligence device. Moreover, the data in the pipeline and the zero data in the computing unit may be removed. Furthermore, only the compressed data is stored in the cache, and thus aspects of the invention may reduce cache storage of AI data to produce higher performance and efficiency than competitors.

BRIEF DESCRIPTION OF DRAWINGS

In order to more clearly describe the technical schemes in the specific embodiments of the present application or in the prior art, hereinafter, the accompanying drawings required to be used in the description of the specific embodiments or the prior art will be briefly introduced. Apparently, the drawings described below show some of the embodiments of present application, and for those skilled in the art, without expenditure of creative labor, other drawings may be derived on the basis of these accompanying drawings.

DETAILED DESCRIPTION

Embodiments of the invention may now be described more fully with reference to the accompanying drawings, which form a part hereof, and which show, by way of illustration, specific exemplary embodiments by which the invention may be practiced. These illustrations and exemplary embodiments may be presented with the understanding that the present disclosure is an exemplification of the principles of one or more inventions and may not be intended to limit any one of the inventions to the embodiments illustrated. The invention may be embodied in many different forms and should not be construed as limited to the embodiments set forth herein; rather, these embodiments are provided so that this disclosure will be thorough and complete, and will fully convey the scope of the invention to those skilled in the art. Among other things, embodiments of the invention may be embodied as methods, systems, computer readable media, apparatuses, or devices. Accordingly, embodiments of the invention may take the form of an entirely hardware embodiment, an entirely software embodiment, or an embodiment combining software and hardware aspects. The following detailed description may, therefore, not to be taken in a limiting sense.

The invention will now be described in further detail with reference to the drawings.

Figure 1:
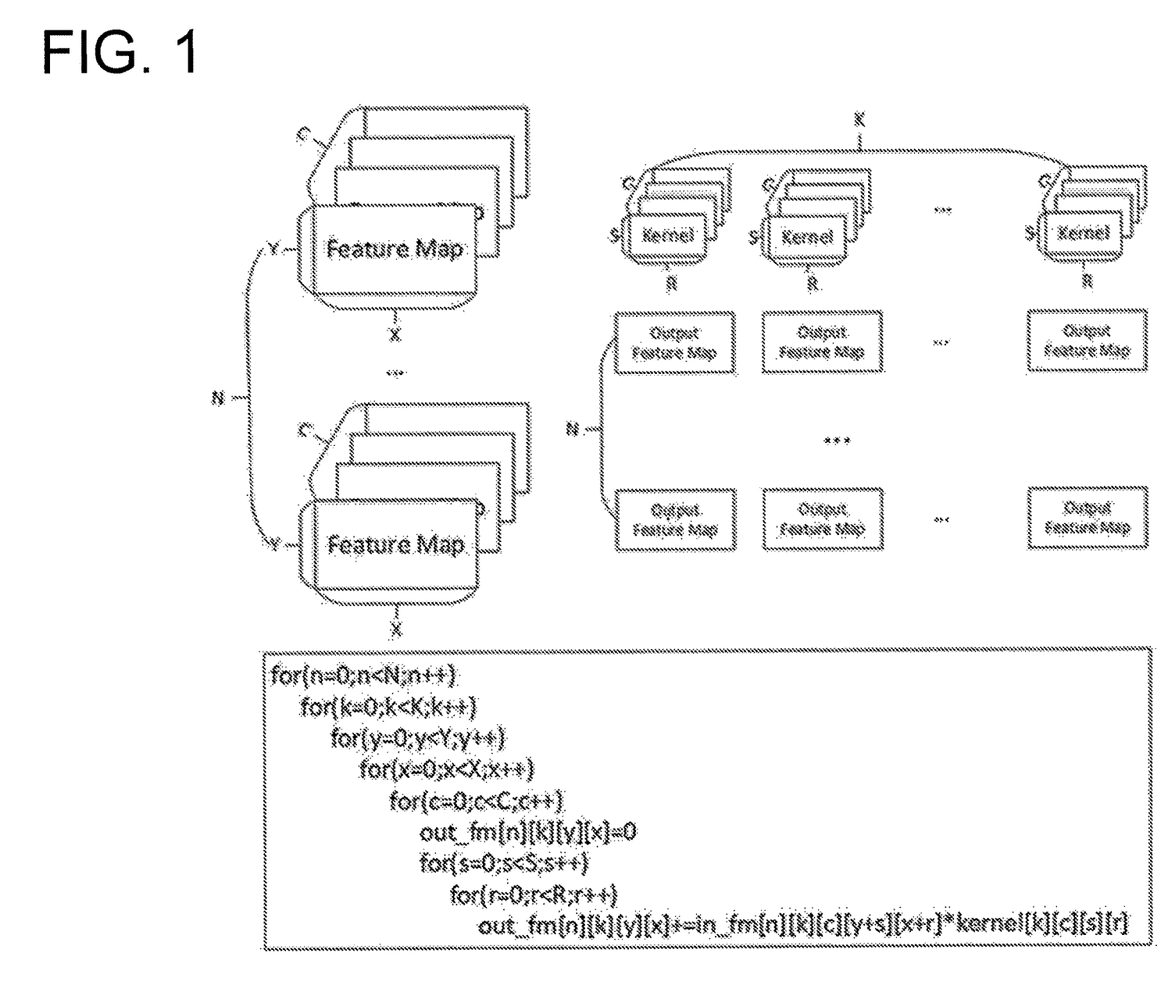
FIG. 1 is an artificial intelligence feature map according to one embodiment of the invention.

As shown in FIG. 1, the artificial intelligence feature map may generally be described as a four-dimensional tensor [N, C, Y, X]. The four dimensions are: feature graph dimensions: X, Y; channel dimension: C; batch dimension: N. The kernel may be a four-dimensional tensor [K, C, S, R]. The AI work gives the input feature tensor and kernel tensor. We calculate the output tensor [N, K, Y, X] according to the formula in FIG. 1.

Figure 2:
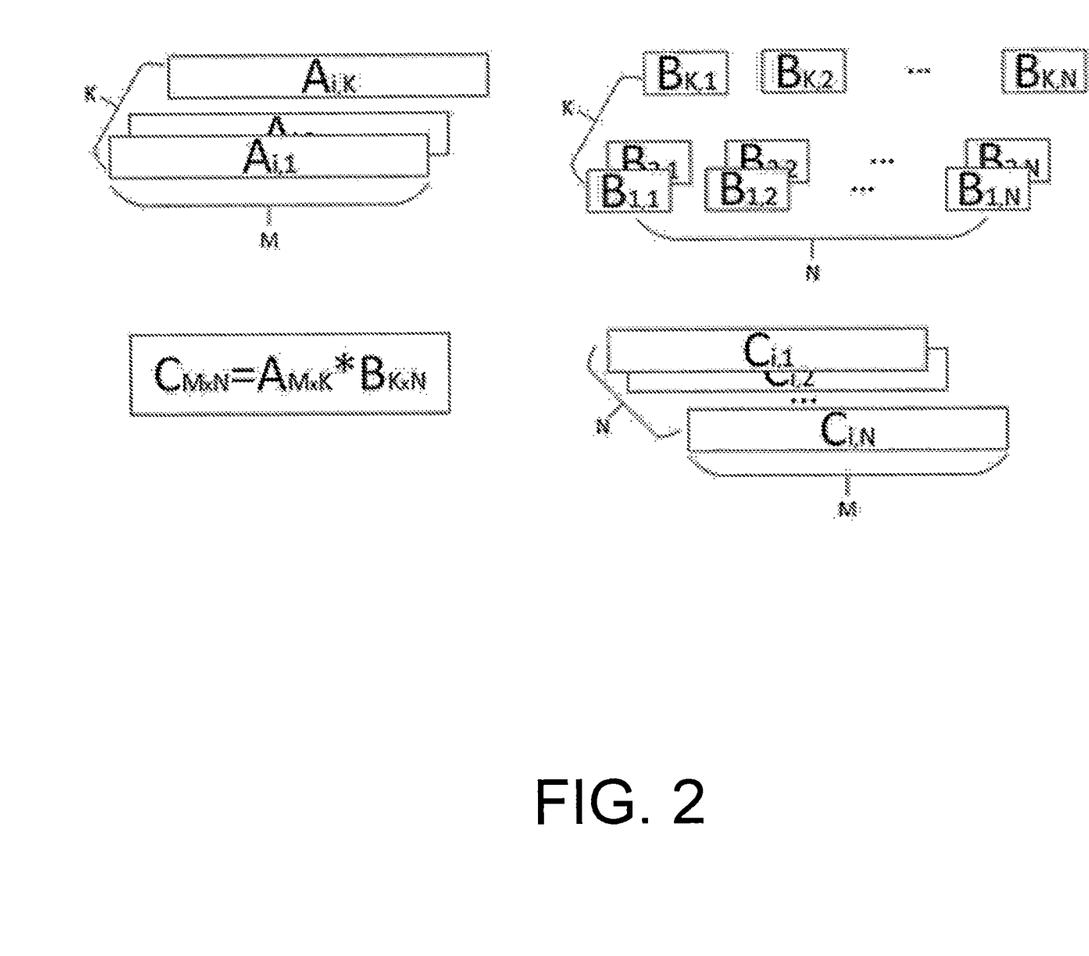
FIG. 2 is a matrix multiplication diagram according to one embodiment of the invention.

Another important operation in artificial intelligence may include matrix multiplication, which may also be mapped into feature map processing. According to FIG. 2, matrix A may be mapped to tensors [1, K, 1, M], matrix B may be mapped to tensors [N, K, 1, 1], and the result C may be tensor [1, N, 1, M].

In addition, in one embodiment, there are other operations, such as normalization, activation, which may be supported in a general purpose hardware operator.

Figure 3:
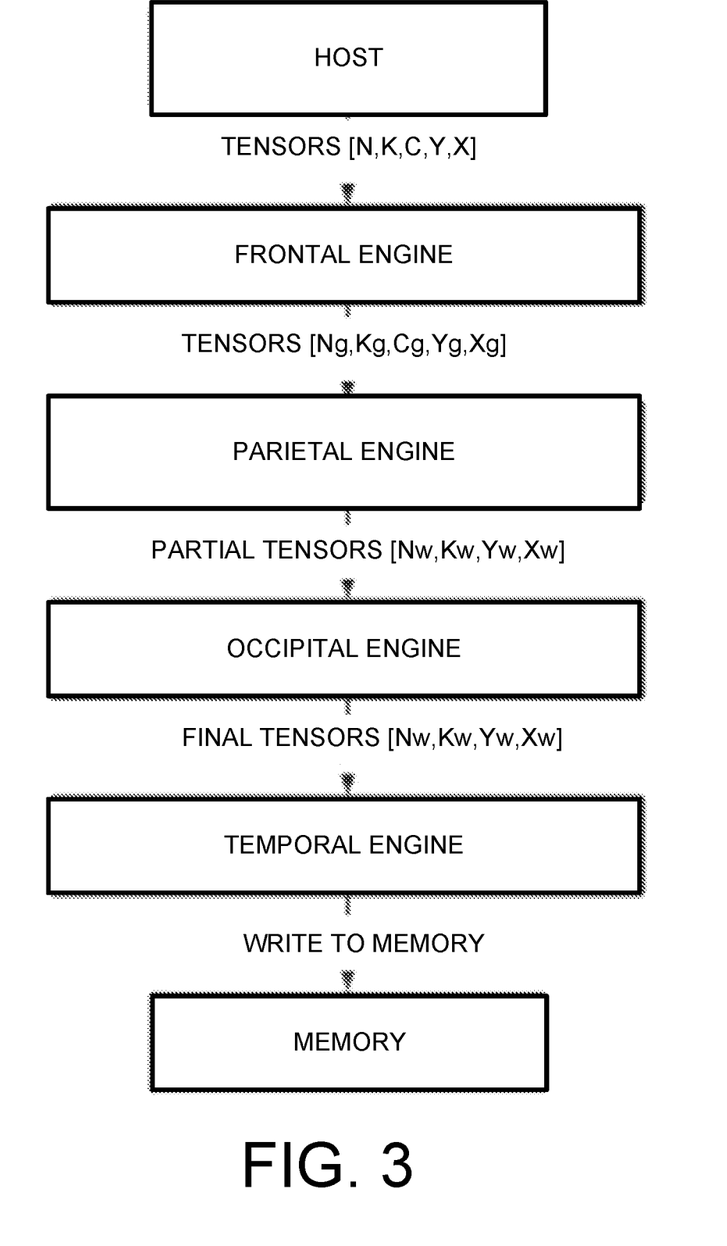
FIG. 3 is an Artificial brain engine flow chart according to one embodiment of the invention.

In one aspect, a hardware architecture may effectively support these operations, artificial intelligence work may be considered as 5-dimensional tensors [N, K, C, Y, X], in each dimension. In one aspect, these tasks may be divided into many Groups, each group may be further divided into several waves. In another embodiment, the architecture may include a first engine, a frontal engine (FE) and may get 5D tensors [N, K, C, Y, X] from the host and divides it into many sets of tensors [Ng, Kg, Cg, Yg, Xg], and send these groups to the parietal engine (PE). The PE may obtain the group tensor and divide it into waves, and may send the waves to a renderer engine to execute the input feature renderer (IF-Shader), and outputs partial tensors [Nw, Kw, Yw, Xw] to the occipital engine (OE). The OE may accumulate a partial tensor and execute an output feature renderer (OF-Shader) to obtain the final tensor sent to the next engine, the temporal engine (TE). The TE may perform some data compression and writes the final tensor into memory. FIG. 3 is a flow chart of the design according to one embodiment of the invention.

Figure 4:
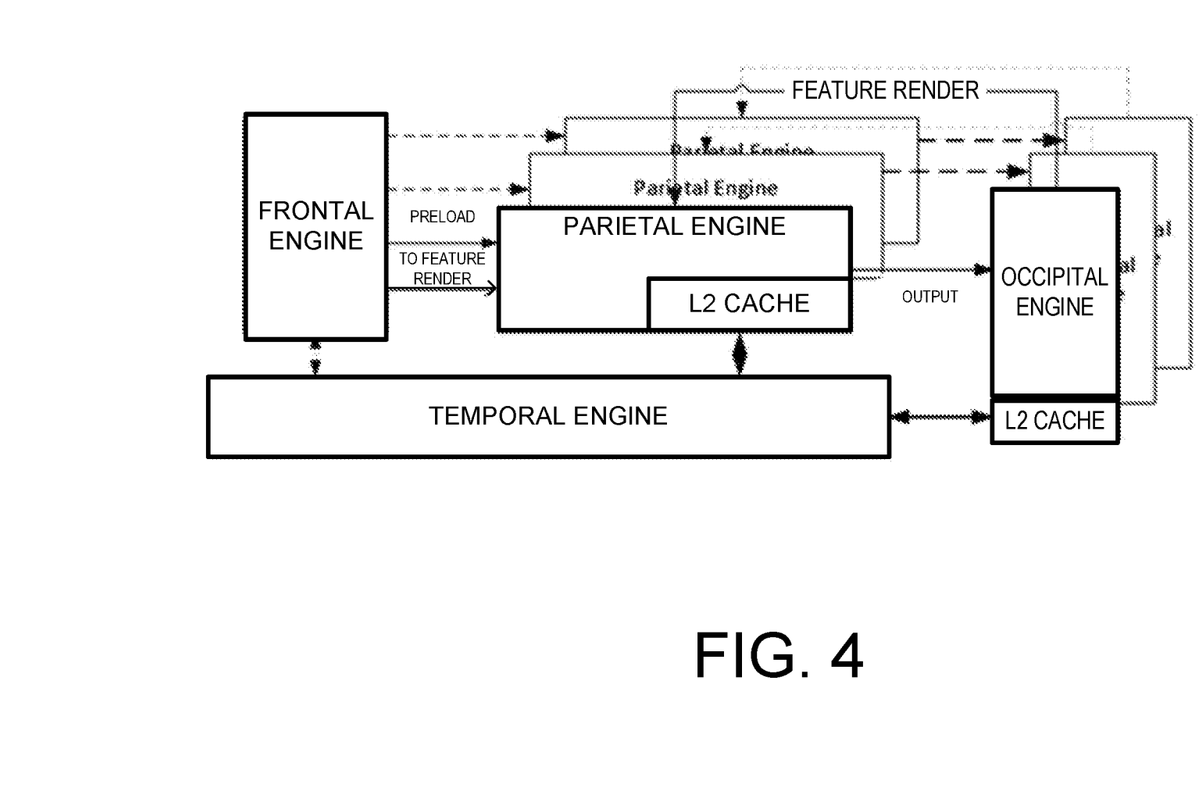
FIG. 4 is an engine level architecture diagram according to one embodiment of the invention.
Figure 5:
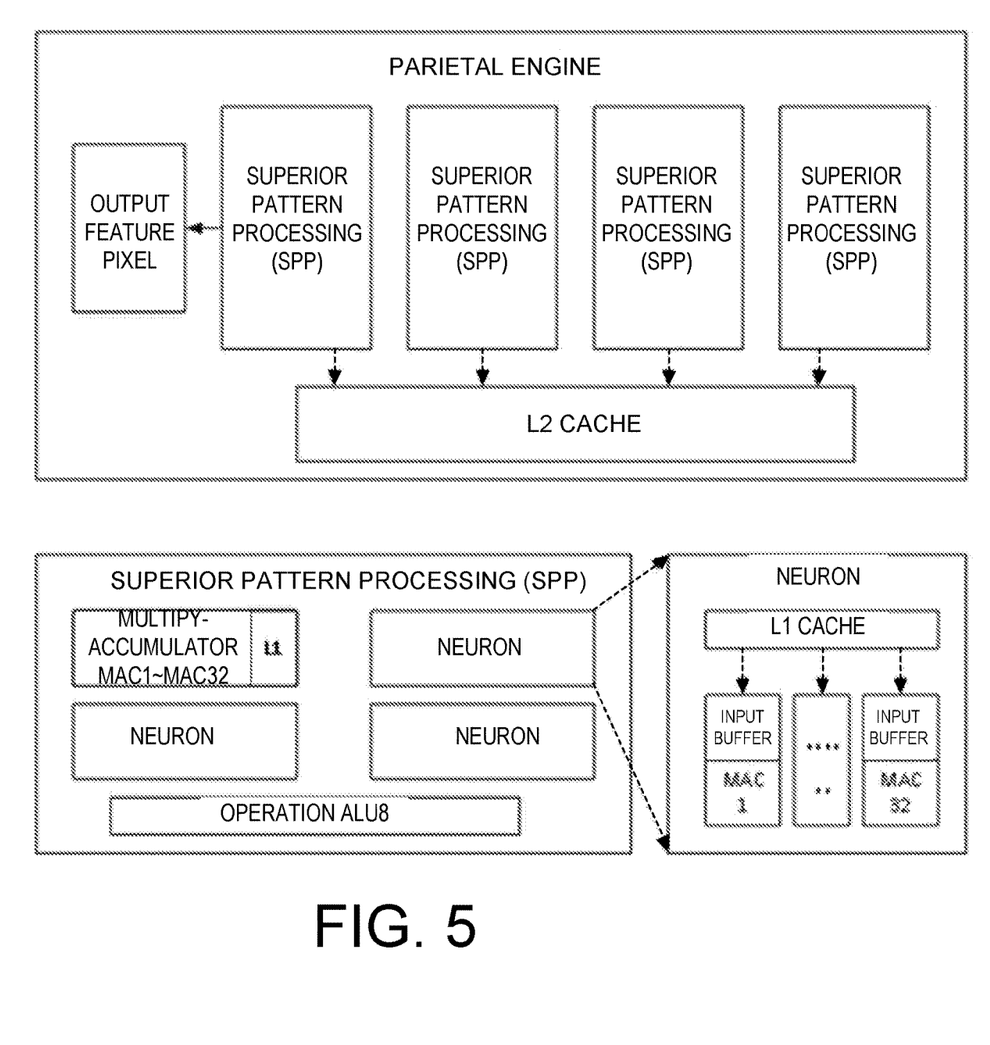
FIG. 5 is a diagram illustrating details of the scalable architecture according to one embodiment of the invention.

In the hardware architecture according to one embodiment of the invention, there is a hierarchical cache design, which is shown in FIGS. 4 and 5. In one embodiment, there is an L3 cache in the TE, and the TE may be connected to the DRAM memory controller to retrieve data from the DRAM memory. In one embodiment, there is an L2 cache in the PE, and an L1 cache in the neuron block.

In a compression scheme, data is stored block by block in DRAM, with each block having the same memory size. For example, the size may be 16×16×2=512 bytes, the non-zero lines in the block are packed and moved to the beginning of the block, all other data in the block is useless. As such, no need to do anything with them. When data is transferred to the L3 cache, only non-zero data is read and stored in the L3 cache, which means that the L3 cache is actually enlarged. The meta-surface of the bit mask is also stored in the DRAM and read before the data, and the valid data length is calculated in the TE for data reading. When the L3 cache sends data to the L2 cache, it decompresses the super tiles and sends the compressed tile data to the L2 cache.

In the L2 cache, data may be stored in a tile compression format, and the data is decompressed, recombined, recompressed, and sent to the L1 cache. These compressed data is read and sent to the computer core, while the uncompressed data with the location is stored in a register file for processing L2.

When the OE obtains the output, it may be compressed, the bitmask and non-zero data will be sent to the TE, which further compresses the data and sends the data to the DRAM.

Figure 6:
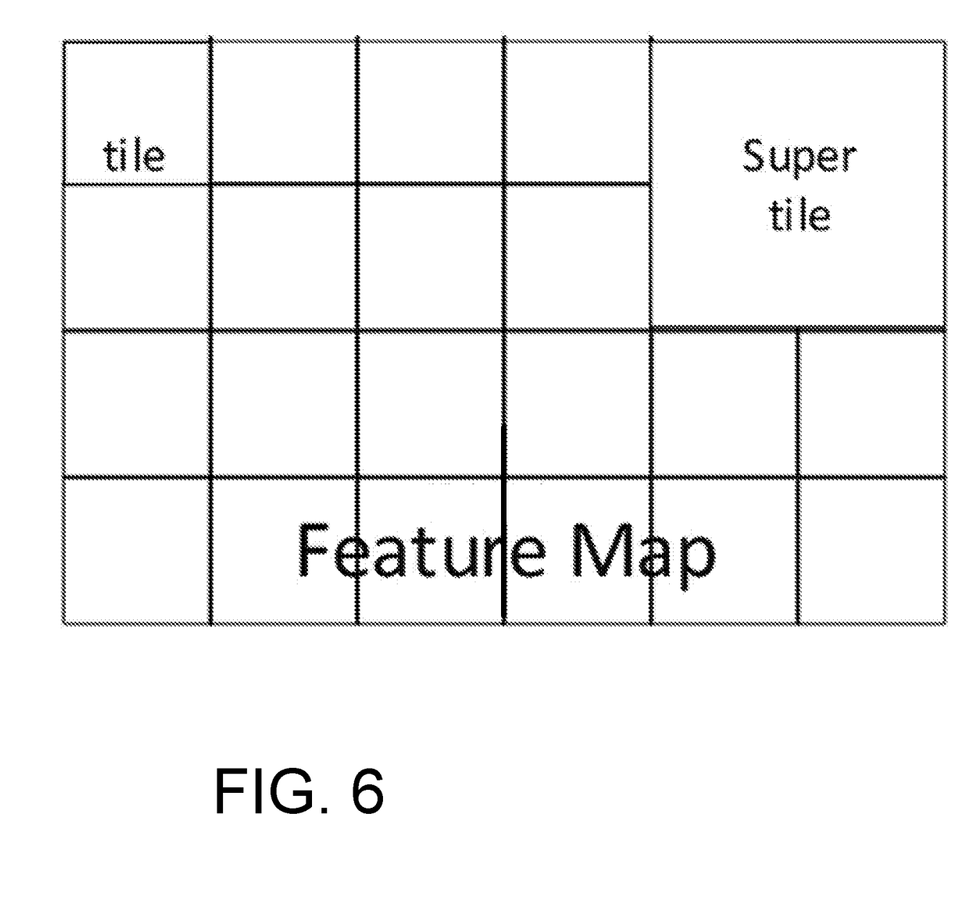
FIG. 6 is a tile level view in the feature map according to one embodiment of the invention.
Figure 7:
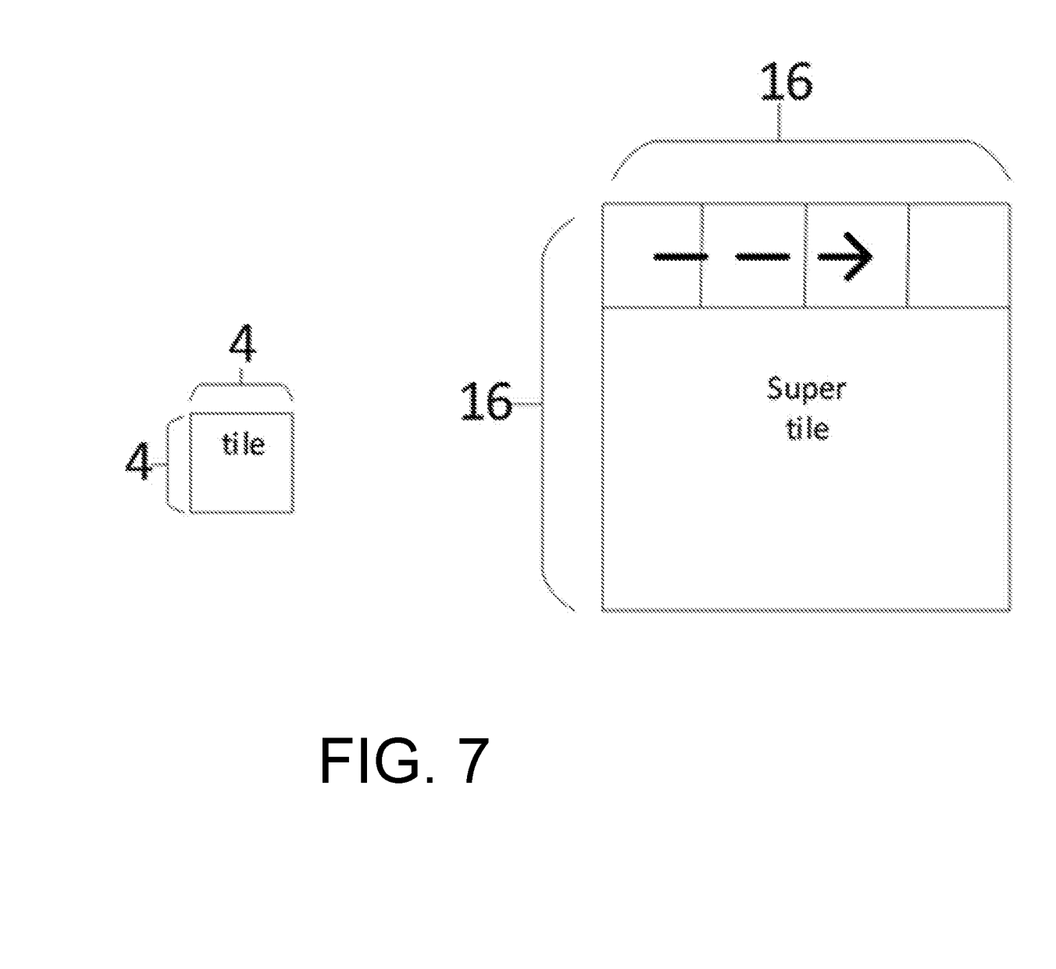
FIG. 7 is an example diagram of tiles and super tiles according to one embodiment of the invention.
Figure 8:
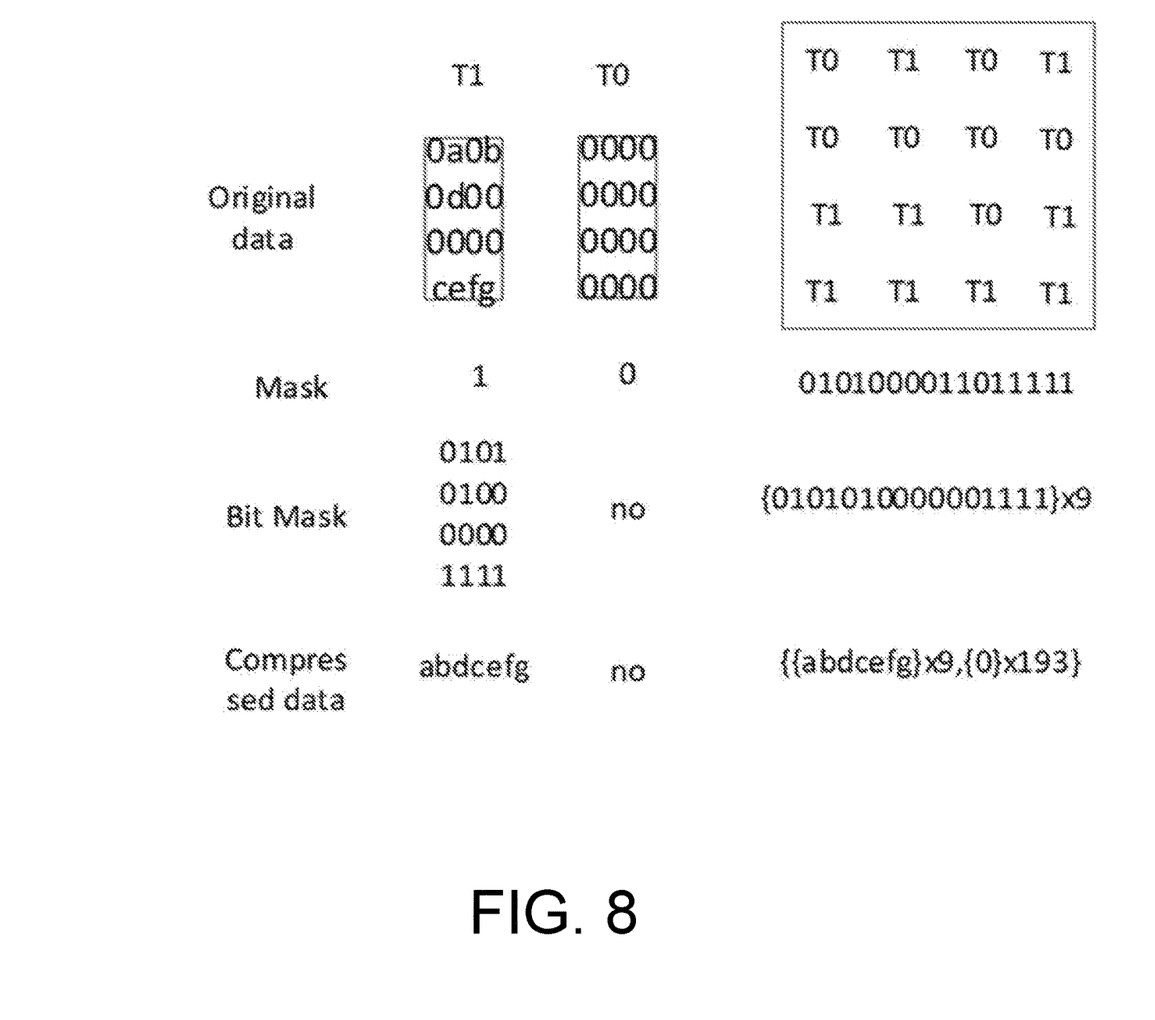
FIG. 8 is an example diagram of compressed tiles and super tiles according to one embodiment of the invention.

Aspects of the invention may use a tile-based layered compression scheme, and an example diagram of a tile hierarchy view, a tile, and a super tile, a compressed tile, and a super tile are shown in FIG. 6, FIG. 7, and FIG. 8, respectively. It is therefore easy to know which tile has all zeros to remove it from the pipeline, which eliminates many unnecessary data movements and saves time and power.

In the DRAM, the storage space of the surface of the neuron may not be saved, and a meta-surface is added to the mask block. But when reading data, the mask is first read, then the size of the non-zero data is calculated, and only these non-zero data are read to save DRAM bandwidth. In the cache, only non-zero data is stored, so the required storage space is reduced (no zero data is stored in the cache). When processing data, only non-zero data is used. DRAM In one embodiment, the method may use a bit mask to determine if the data is zero, and there are three layers in the hierarchical compression scheme: tiles, lines, and points. The bit mask and non-zero data are read from the DRAM, thus saving bandwidth by not reading zero data. When processing data, if their bit mask is zero, the tile data may be easily removed.

Aspects of the invention may apply the AI device, which may save DRAM bandwidth and removes data in the pipeline and removes zero data in the compute unit. Therefore, higher performance and efficiency may be achieved and may be better than the competition It should be noted that the terms "upper", "lower", "left", "right", "front", "rear" and the like cited in the invention are also merely for convenience of description. It is not intended to limit the scope of the invention, and the change or adjustment of the relative relationship is also considered to be within the scope of the invention.

The above is only a preferred embodiment of the invention, and the scope of protection of the invention is not limited to the above embodiments, and all the technical solutions under the inventive concept belong to the protection scope of the invention. It should be noted that a number of improvements and modifications of the invention without departing from the principles of the invention are considered to be within the scope of the invention.

Apparently, the aforementioned embodiments are merely examples illustrated for clearly describing the present application, rather than limiting the implementation ways thereof. For a person skilled in the art, various changes and modifications in other different forms may be made on the basis of the aforementioned description. It is unnecessary and impossible to exhaustively list all the implementation ways herein. However, any obvious changes or modifications derived from the aforementioned description are intended to be embraced within the protection scope of the present application.

The example embodiments may also provide at least one technical solution to a technical challenge. The disclosure and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the disclosure. The examples used herein are intended merely to facilitate an understanding of ways in which the disclosure may be practiced and to further enable those of skill in the art to practice the embodiments of the disclosure. Accordingly, the examples and embodiments herein should not be construed as limiting the scope of the disclosure. Moreover, it is noted that like reference numerals represent similar parts throughout the several views of the drawings.

The terms "including," "comprising" and variations thereof, as used in this disclosure, mean "including, but not limited to," unless expressly specified otherwise.

The terms "a," "an," and "the," as used in this disclosure, means "one or more," unless expressly specified otherwise.

Although process steps, method steps, algorithms, or the like, may be described in a sequential order, such processes, methods and algorithms may be configured to work in alternate orders. In other words, any sequence or order of steps that may be described does not necessarily indicate a requirement that the steps be performed in that order. The steps of the processes, methods or algorithms described herein may be performed in any order practical. Further, some steps may be performed simultaneously.

When a single device or article is described herein, it will be readily apparent that more than one device or article may be used in place of a single device or article. Similarly, where more than one device or article is described herein, it will be readily apparent that a single device or article may be used in place of the more than one device or article. The functionality or the features of a device may be alternatively embodied by one or more other devices which are not explicitly described as having such functionality or features.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, may comprise processor-implemented modules.

Similarly, the methods or routines described herein may be at least partially processor-implemented. For example, at least some of the operations of a method may be performed by one or more processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, nonvolatile memory, or a combination thereof), registers, or other machine components that receive, store, transmit, or display information.

While the disclosure has been described in terms of exemplary embodiments, those skilled in the art will recognize that the disclosure may be practiced with modifications that fall within the spirit and scope of the appended claims. These examples given above are merely illustrative and are not meant to be an exhaustive list of all possible designs, embodiments, applications, or modification of the disclosure.

In summary, the integrated circuit with a plurality of transistors, each of which may have a gate dielectric with properties independent of the gate dielectric for adjacent transistors provides for the ability to fabricate more complex circuits on a semiconductor substrate. The methods of fabricating such an integrated circuit structures further enhance the flexibility of integrated circuit design. Although the invention has been shown and described with respect to certain preferred embodiments, it is obvious that equivalents and modifications will occur to others skilled in the art upon the reading and understanding of the specification. Embodiments of the invention include all such equivalents and modifications, and is limited only by the scope of the following claims.

What is claimed is:

1. A layered sparse tensor compression method based on artificial intelligence device, wherein a hardware architecture comprising:
    a host, frontal engine, parietal engine, renderer engine, parietal engine, occipital engine and memory; frontal engine gets 5D tensor from the host, divides it into several groups of tensors, and the group tensor is sent to the parietal engine; the parietal engine acquires the group tensor and divides it into a number of scalar waves, and the parietal engine sends the tensor waves to the renderer engine to execute the input feature renderer and output a partial tensor to the occipital engine; the parietal engine accumulates a partial tensor and executes an output feature renderer to obtain the final tensor sent to the temporal engine; the temporal engine performs data compression and writes the final tensor into memory;
    wherein the hardware architecture has a layered cache design: the L3 cache is provided in the occipital engine, the occipital engine is connected to the DRAM memory controller to retrieve data from the DRAM memory, and the parietal engine has an L2 cache and a neuron L1 cache in the block;
    wherein the DRAM memory, not only save the storage space of the neuron surface, but also add a meta surface to a mask block; when reading data, first read the mask, then calculate the size of non-zero data, and only read non-zero data; in the cache, only non-zero data is stored;
    when processing data, only non-zero data is used.

2. The method for layered sparse tensor compression based on artificial intelligence device according to claim 1, wherein in the compression method, data is stored in a DRAM block by block, and each block has the same memory size in the block, non-zero rows are packed and moved to the beginning of the block, and all other data in the block is useless.

3. The method for layered sparse tensor compression based on artificial intelligence device according to claim 2, wherein when data is transmitted to the L3 cache, only non-zero data is read and stored in the L3 cache, the meta-surface of the bit mask is also stored in DRAM and read before the data, calculating the effective data length in the occipital engine for data reading; when the L3 buffer sends data to the L2 cache, decompress the super tile; and the decompressed tile data is sent to the L2 cache.

4. The method for layered sparse tensor compression based on artificial intelligence device according to claim 3, wherein in the L2 cache, data is stored in a tile compression format, and the data is decompressed, recombined, recompressed, and transmitted to the L1 cache, the compressed data is read and sent to the computer core, and the uncompressed data with the location is stored in a register file for processing.

5. The method for layered sparse tensor compression based on artificial intelligence device according to claim 4, wherein when the parietal engine obtains an output result, the data is compressed, and a bit mask and non-zero data are sent to the file; wherein the temporal engine further compresses the data and sends the data to the DRAM.

* * * * *